United States Patent
Kobayashi (10) Patent No.: US 9,673,068 B2
(45) Date of Patent: Jun. 6, 2017

(54) APPARATUS AND METHOD FOR PROCESSING SUBSTRATE WITH FILM HAVING POROUS STRUCTURE (POROUS FILM) FORMED ON SURFACE LAYER THEREOF

(71) Applicant: SCREEN Holdings Co., Ltd., Kyoto (JP)

(72) Inventor: Kenji Kobayashi, Kyoto (JP)

(73) Assignee: SCREEN Holdings Co., Ltd, Kyoto (JP)

( * ) Notice: Subject to any disclaimer, the term of this patent is extended or adjusted under 35 U.S.C. 154(b) by 0 days.

(21) Appl. No.: 14/570,435

(22) Filed: Dec. 15, 2014

(65) Prior Publication Data

US 2015/0200087 A1 Jul. 16, 2015

(30) Foreign Application Priority Data

Jan. 15, 2014 (JP) .................................. 2014-004974

(51) Int. Cl.
*B08B 3/08* (2006.01)
*H01L 21/67* (2006.01)
(Continued)

(52) U.S. Cl.
CPC .. *H01L 21/67051* (2013.01); *H01L 21/02203* (2013.01); *H01L 21/02334* (2013.01); *B08B 3/10* (2013.01)

(58) Field of Classification Search
CPC ......... H01L 21/67051; H01L 21/02203; H01L 21/02334; B08B 3/10
(Continued)

(56) References Cited

U.S. PATENT DOCUMENTS 5,932,493 A    8/1999   Akatsu et al. ................ 438/745
6,077,731 A    6/2000   Yamazaki et al. ............ 438/150
(Continued)

FOREIGN PATENT DOCUMENTS

CN        1160758 C    8/2004
CN    101093788 A    12/2007
(Continued)

OTHER PUBLICATIONS

Taiwanese Office Action dated Jan. 28, 2016 with partial English translation based on Japanese translation.
(Continued)

*Primary Examiner* — Binh X Tran
*Assistant Examiner* — Maki Angadi
(74) *Attorney, Agent, or Firm* — Ostrolenk Faber LLP (57) ABSTRACT

A method for processing a substrate with a porous film having a porous structure formed on a surface layer thereof includes the following a) and b) steps. The a) step is a step of mixing a first processing solution containing water with gas to generate droplets of the first processing solution and injecting the droplets of the first processing solution to the porous film. In addition, the b) step is a step of, after the a) step, mixing a second processing solution which is an organic solvent having higher volatility than the first processing solution with the gas to generate droplets of the second processing solution and injecting the droplets of the second processing solution to the porous film.

8 Claims, 8 Drawing Sheets

(51) Int. Cl.
*H01L 21/02* (2006.01)
*B08B 3/10* (2006.01)

(58) Field of Classification Search
USPC .............. 216/37, 62; 134/19, 30, 31, 34, 35, 134/102.1, 94.1; 438/745, 749, 757
See application file for complete search history.

(56) References Cited

U.S. PATENT DOCUMENTS

| | | | |
|---|---|---|---|
| 6,247,479 B1 | 6/2001 | Taniyama et al. | 134/95.2 |
| 7,524,771 B2 | 4/2009 | Izumi et al. | 438/745 |
| 7,785,421 B2 | 8/2010 | Hayashi | 134/26 |
| 8,607,807 B2 * | 12/2013 | Higashijima | H01L 21/67051 134/102.1 |
| 8,673,086 B2 * | 3/2014 | Tamura | H01L 21/02057 134/19 |
| 8,821,974 B2 | 9/2014 | Kimura et al. | 427/248.1 |
| 8,877,653 B2 | 11/2014 | Yamaguchi et al. | |
| 8,883,026 B2 | 11/2014 | Ota et al. | |
| 2001/0004898 A1 * | 6/2001 | Kamikawa | H01L 21/67028 134/2 |
| 2002/0051644 A1 | 5/2002 | Sugimoto et al. | 396/564 |
| 2003/0178047 A1 | 9/2003 | Hirae | |
| 2007/0000524 A1 | 1/2007 | Kimura | 134/42 |
| 2007/0017555 A1 | 1/2007 | Sekiguchi et al. | 134/33 |
| 2007/0289611 A1 | 12/2007 | Hayashi | 134/26 |
| 2007/0295365 A1 | 12/2007 | Miya et al. | 134/26 |
| 2008/0052947 A1 | 3/2008 | Miya | 34/317 |
| 2010/0307543 A1 | 12/2010 | Sekiguchi et al. | 134/94.1 |
| 2011/0155177 A1 | 6/2011 | Tamura et al. | |
| 2014/0283882 A1 | 9/2014 | Kimura et al. | 134/26 |

FOREIGN PATENT DOCUMENTS

| | | |
|---|---|---|
| CN | 101847567 A | 9/2010 |
| CN | 102099900 | 6/2011 |
| JP | 10-335298 | 12/1998 |
| JP | 11-102890 | 4/1999 |
| JP | 2003-059894 | 2/2003 |
| JP | 2003-275696 | 9/2003 |
| JP | 2007-012859 | 1/2007 |
| JP | 2007-036180 | 2/2007 |
| JP | 2008-034779 | 2/2008 |
| JP | 2008-060106 | 3/2008 |
| JP | 2009-021617 | 1/2009 |
| JP | 2009-188116 | 8/2009 |
| JP | 2009-238793 | 10/2009 |
| JP | 2011-077153 | 4/2011 |
| JP | 2012-209299 | 10/2012 |
| KR | 1020060102042 | 9/2006 |
| KR | 1020110028532 | 3/2011 |
| KR | 10-2012-0086235 | 10/2012 |
| TW | 200729315 | 1/1995 |
| TW | 201344777 | 11/2003 |
| TW | 201340199 | 10/2013 |

OTHER PUBLICATIONS

Korean Office Action dated Oct. 10, 2016 with partial English translation based on Japanese translation of same.
Korean Office Action dated Jan. 6, 2016 with English partial translation (based on Japanese translation).
Decision of Grant dated Jul. 1, 2016, issued for a Korean counterpart of the above-identified application.
Decision of Grant issued Dec. 28, 2016 in corresponding Taiwan Application No. 105127715.
Chinese Office Action dated Jan. 25, 2017 issued for Chinese counterpart Application No. 201510017552.8 with English partial translation of the Chinese Office Action based on Japanese translation.
Apr. 7, 2017 Korean Office Action (Application No. 10-2016-0112697) with partial English translation based on Japanese translation of same.

* cited by examiner

APPARATUS AND METHOD FOR PROCESSING SUBSTRATE WITH FILM HAVING POROUS STRUCTURE (POROUS FILM) FORMED ON SURFACE LAYER THEREOF

BACKGROUND OF THE INVENTION

Field of the Invention

The present invention relates to a technique for processing a substrate with a film having a porous structure (porous film) formed on a surface layer thereof. Examples of the substrate to be processed include e.g., a semiconductor wafer, a substrate for a liquid crystal display device, a substrate for a plasma display, a substrate for an FED (Field Emission Display), a substrate for an optical disk, a substrate for a magnetic disk, a substrate for a magneto-optical disk, a substrate for a photomask, a ceramic substrate, and a substrate for a solar battery.

Description of the Background Art

In a manufacturing process of a semiconductor device and a liquid crystal display device, a cleaning process for removing foreign substances from a substrate, such as a semiconductor wafer and a glass substrate for a liquid crystal display device, is carried out. For the cleaning process, for example, Japanese Patent Application Laid-Open Nos. 2009-21617 and 2011-77153 disclose a technique in which a so-called two-fluid nozzle is used to mix deionized water with gas for generating droplets of the deionized water, and the droplets of the deionized water is injected to a substrate to physically remove foreign substances adhering to the substrate by the kinetic energy of the droplets of the deionized water which are collided with the substrate.

In recent years, to meet a request to lower the dielectric constant of an interlayer dielectric film, a technique in which a film having a relative permittivity of 2.5 or less (a so-called Ultra Low-k film: ULK film), which has difficulty in being achieved with a dense film, is achieved with a porous film having a porous structure has been in practical use.

As described in US 2003/178047, such a porous film resists water (water causes change in dielectric constant), and consequently, it is unfavorable that the porous film is cleaned with the deionized water. Accordingly, for example, US 2003/178047 proposes that in place of the deionized water, IPA (isopropyl alcohol) is used to clean the substrate having the porous film.

When the droplet generation conditions (the flow rate of a processing solution and the flow rate of the gas) are made equal to compare the case of using the IPA as the processing solution to clean the substrate with droplets of the IPA with the case of using the deionized water as the processing solution to clean the substrate with droplets of the deionized water, it is found that the former can obtain only a lower foreign substance removal effect than the latter. Therefore, when the substrate with the porous film formed on the surface layer thereof is cleaned only with the droplets of the IPA, not with the deionized water, although damages to the substrate are prevented, no foreign substances can be removed sufficiently from the substrate unless injection of the droplets of the IPA is continued for a considerably long time. In this form, the processing time becomes long, and the IPA consumption amount cannot be avoided from increasing. Consequently, an alternative method which can sufficiently clean the substrate with the porous film formed on the surface layer thereof has been demanded.

SUMMARY OF THE INVENTION

The present invention is directed to a method for processing a substrate with a porous film having a porous structure formed on a surface layer thereof.

In one aspect of the present invention, the substrate processing method includes a) mixing a first processing solution containing water with gas to generate droplets of the first processing solution and injecting the droplets of the first processing solution to the porous film, and b) after the a) step, mixing a second processing solution which is an organic solvent having higher volatility than the first processing solution with the gas to generate droplets of the second processing solution and injecting the droplets of the second processing solution to the porous film.

The droplets of the first processing solution containing water can effectively remove foreign substances adhering to the substrate. At this time, in the next step, the first processing solution which has entered into the porous portions of the porous film is substituted by the second processing solution, and is then removed from the interior of the porous portions. Therefore, damages to the substrate due to remaining of the first processing solution containing water in the porous portions can be prevented from occurring. In addition, the second processing solution in the porous portions volatilizes immediately, so that the second processing solution cannot cause the damages to the substrate. Thus, the substrate with the porous film formed on the surface layer thereof can be cleaned sufficiently while the damages are prevented.

Preferably, the first processing solution is deionized water.

Preferably, the second processing solution is isopropyl alcohol.

Preferably, in the a) step, while the landed position of the droplets of the first processing solution is moved, the droplets of the first processing solution are injected to the porous film.

Since the landed position of the droplets of the first processing solution is moved, the droplets of the first processing solution can be collided with the wide range in the top surface of the substrate. Thereby, the interior of the top surface of the substrate can be cleaned particularly sufficiently.

Preferably, in the b) step, while the landed position of the droplets of the second processing solution is moved, the droplets of the second processing solution are injected to the porous film.

Since the landed position of the droplets of the second processing solution is moved, the droplets of the second processing solution can be collided with the wide range in the top surface of the substrate. Thereby, the damages to the interior of the top surface of the substrate can be prevented from occurring particularly sufficiently.

In addition, the present invention is directed to an apparatus for processing a substrate with a porous film having a porous structure formed on the surface layer thereof.

In one aspect of the present invention, the substrate processing apparatus includes a holding unit holding the substrate, a two-fluid nozzle mixing a processing solution with gas to generate droplets of the processing solution and injecting the droplets, and a controlling unit allowing the two-fluid nozzle to generate droplets of a first processing solution containing water and to inject the droplets of the first processing solution to the porous film and then allowing the two-fluid nozzle to generate droplets of a second processing solution which is an organic solvent having higher volatility than the first processing solution and to inject the droplets of the second processing solution to the porous film.

Therefore, an object of the present invention is to provide a technique in which a substrate with a porous film formed on the surface layer thereof can be cleaned sufficiently while damages are prevented.

These and other objects, features, aspects and advantages of the present invention will become more apparent from the following detailed description of the present invention when taken in conjunction with the accompanying drawings.

DESCRIPTION OF THE PREFERRED EMBODIMENTS

A preferred embodiment will be described below with reference to the drawings. The following preferred embodiment is an example embodying the present invention, and does not limit the technical scope of the present invention. In addition, in the drawings to be referred below, to facilitate understanding, the size and number of the respective portions are sometimes exaggerated or simplified.

<1. The Configuration of a Substrate Processing Apparatus 100>

Figure 1:
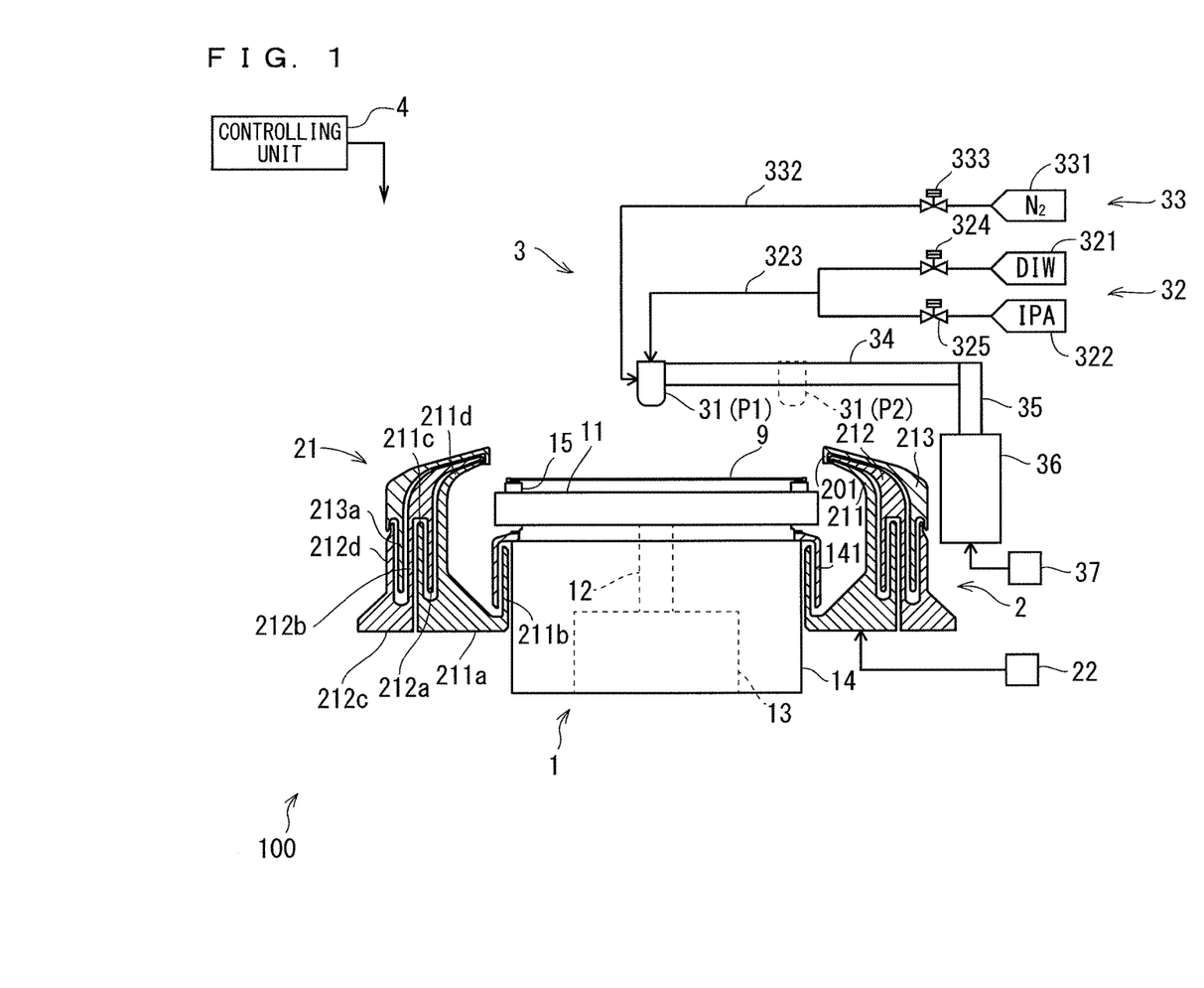
FIG. 1 is a schematic side view of a substrate processing apparatus.

The substrate processing apparatus 100 is a sheet type substrate processing apparatus which processes each disk-like substrate 9, such as a semiconductor wafer. The configuration of the substrate processing apparatus 100 will be described with reference to FIG. 1. FIG. 1 is a schematic side view of the substrate processing apparatus 100.

The substrate processing apparatus 100 has a spin chuck 1, a scatter preventing unit 2, a droplet supplying unit 3, and a controlling unit 4.

<Spin Chuck 1>

The spin chuck 1 is a substrate holding unit which holds the substrate 9 in the substantially horizontal posture, and rotates the substrate 9 about a vertical rotational axis which passes through the center of the principal plane thereof.

The spin chuck 1 has a spin base 11 which is a disk-like member slightly larger than the substrate 9. To the center of the lower surface of the spin base 11, a rotational shaft 12 is connected. The rotational shaft 12 is arranged in the posture such that the axis thereof extends in the vertical direction. To the rotational shaft 12, a rotational driving unit (e.g., motor) 13 which rotationally drives the rotational shaft 12 about the axis thereof is connected. The rotational shaft 12 and the rotational driving unit 13 are accommodated in a tubular casing 14. Near the peripheral edge of the top surface of the spin base 11, plural (e.g., six) holding members 15 are provided at appropriate intervals. The holding members 15 are abutted onto an end face of the substrate 9 to position the substrate 9 in the horizontal direction, and hold the substrate 9 in the substantially horizontal posture at the position slightly higher than the top surface of the spin base 11 (that is, with a predetermined spacing from the top surface of the spin base 11).

In this configuration, while the holding members 15 hold the substrate 9 above the spin base 11, when the rotational driving unit 13 rotates the rotational shaft 12, the spin base 11 is rotated about the axis thereof in the vertical direction, whereby the substrate 9 held on the spin base 11 is rotated about the vertical rotational axis which passes through the center in the plane thereof.

Figure 3:
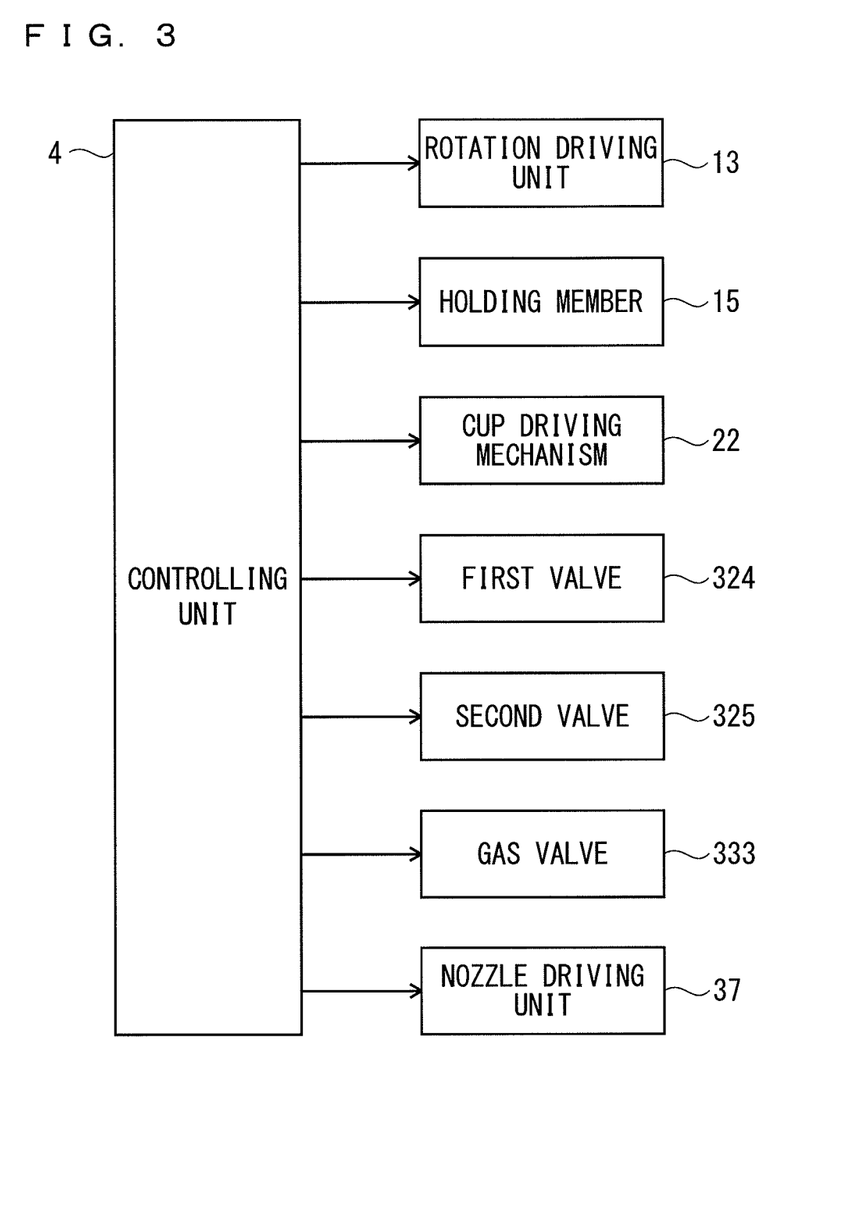
FIG. 3 is a block diagram showing the electric configuration of the substrate processing apparatus.

The rotational driving unit 13 and the holding members 15 are electrically connected to the controlling unit 4, and are operated under control of the controlling unit 4 (see FIG. 3). That is, the timing to hold the substrate 9 on the spin base 11, the timing to release the held substrate 9, and the rotational forms of the spin base 11 (specifically, the rotation start timing, the rotation end timing, and the number of rotations (namely, rotational speed)) are controlled by the controlling unit 4.

<Scatter Preventing Unit 2>

The scatter preventing unit 2 receives a processing solution scattered from the substrate 9 held and rotated on the spin base 11.

The scatter preventing unit 2 has a cup 21. The cup 21 is a tubular member having an opened upper end, and surrounds the spin chuck 1. The cup 21 has, e.g., an inner member 211, an intermediate member 212, and an outer member 213.

The inner member 211 is a tubular member having an opened upper end, and has an annular bottom member 211a, a cylindrical inner wall member 211b extending upwardly from the inside edge of the bottom member 211a, a cylindrical outer wall member 211c extending upwardly from the outside edge of the bottom member 211a, and a cylindrical guide wall 211d erected between the inner wall member 211b and the outer wall member 211c. The guide wall 211d extends upwardly from the bottom member 211a, and is curved inwardly and upwardly near the upper end thereof. The inner wall member 211b at least in the vicinity of the leading end thereof is accommodated in the inside space of a collar-shaped member 141 provided to the casing 14 of the spin chuck 1.

In the bottom member 211a, a liquid discharge channel (not shown) communicated with the space between the inner wall member 211b and the guide wall 211d is formed. The liquid discharge channel is connected to the liquid discharge line of a factory. In addition, a gas/liquid discharge mechanism is connected to the liquid discharge channel, the gas/liquid discharge mechanism forcibly evacuates the interior of the channel to bring the space between the inner wall member 211b and the guide wall 211d into a negative pressure state. The space between the inner wall member 211b and the guide wall 211d is a space for collecting and discharging the processing solution used for processing the substrate 9, and the processing solution collected in the space is discharged from the liquid discharge channel.

In addition, in the bottom member 211a, a first recovery channel (not shown) communicated with the space between the guide wall 211*d* and the outer wall member 211*c* is formed. The first recovery channel is connected to a first recovery tank. In addition, a gas/liquid discharge mechanism is connected to the first recovery channel, the gas/liquid discharge mechanism forcibly evacuates the interior of the channel to bring the space between the guide wall 211*d* and the outer wall member 211*c* into a negative pressure state. The space between the guide wall 211*d* and the outer wall member 211*c* is a space for collecting and recovering the processing solution used for processing the substrate 9, and the processing solution collected in the space is recovered through the first recovery channel into the first recovery tank.

The intermediate member 212 is a tubular member having an opened upper end, and is provided outside the guide wall 211*d* of the inner member 211. The upper portion of the intermediate member 212 is curved inwardly and upwardly, and the upper end edge thereof is bent along the upper end edge of the guide wall 211*d*.

An inner peripheral wall member 212*a* and an outer peripheral wall member 212*b* are formed in the lower portion of the intermediate member 212, the inner peripheral wall member 212*a* extends downwardly along the inner peripheral surface thereof and the outer peripheral wall member 212*b* extends downwardly along the outer peripheral surface thereof. In a state where the inner member 211 and the intermediate member 212 are close to each other (in the state shown in FIG. 1), the inner peripheral wall member 212*a* is accommodated between the guide wall 211*d* and the outer wall member 211*c* of the inner member 211. The lower end of the outer peripheral wall member 212*b* is secured to the inside edge of an annular bottom member 212*c*. From the outside edge of the bottom member 212*c*, a cylindrical outer wall member 212*d* extending upwardly is erected.

In the bottom member 212*c*, a second recovery channel (not shown) communicated with the space between the outer peripheral wall member 212*b* and the outer wall member 212*d* is formed. The second recovery channel is connected to a second recovery tank. In addition, a gas/liquid discharge mechanism is connected to the second recovery channel, the gas/liquid discharge mechanism forcibly evacuates the interior of the channel to bring the space between the outer peripheral wall member 212*b* and the outer wall member 212*d* into a negative pressure state. The space between the outer peripheral wall member 212*b* and the outer wall member 212*d* is a space for collecting and recovering the processing solution used for processing the substrate 9, and the processing solution collected in the space is recovered through the second recovery channel into the second recovery tank.

The outer member 213 is a tubular member having an opened upper end, and is provided outside the intermediate member 212. The upper portion of the outer member 213 is curved inwardly and upwardly, and an upper end edge 201 thereof is bent downwardly and slightly inwardly of the upper end edge of the intermediate member 212 and the upper end edge of the inner member 211. In a state where the inner member 211, the intermediate member 212, and the outer member 213 are close to each other (in the state shown in FIG. 1), the upper end edge of the intermediate member 212 and the upper end edge of the inner member 211 are covered by the bent portion of the outer member 213.

In the lower portion of the outer member 213, an inner peripheral wall member 213*a* is formed to extend downwardly along the inner peripheral surface thereof. In a state where the intermediate member 212 and the outer member 213 are close to each other (in the state shown in FIG. 1), the inner peripheral wall member 213*a* is accommodated between the outer peripheral wall member 212*b* and the outer wall member 212*d* of the intermediate member 212.

In the cup 21, a cup driving mechanism 22 lifting and lowering the cup 21 is arranged. The cup driving mechanism 22 includes, e.g., a stepping motor. The cup driving mechanism 22 independently lifts and lowers the three members 211, 212, and 213 of the cup 21.

Each of the inner member 211, the intermediate member 212, and the outer member 213 is driven by the cup driving mechanism 22, and is then moved between the upper and lower positions. Here, the upper position of each of the members 211, 212, and 213 is the position where the upper end edge of each of the members 211, 212, and 213 is placed sidewardly of the substrate 9 held on the spin base 11. The lower position of each of the members 211, 212, and 213 is the position where the upper end edge of each of the members 211, 212, and 213 is placed below the top surface of the spin base 11. However, the cup driving mechanism 22 is electrically connected to the controlling unit 4, and is operated under control of the controlling unit 4 (see FIG. 3). That is, the position of the cup 21 (specifically, the position of each of the inner member 211, the intermediate member 212, and the outer member 213) is controlled by the controlling unit 4.

The state where the outer member 213 is placed in the lower position (that is, the state where all of the inner member 211, the intermediate member 212, and the outer member 213 are placed in the lower position) is hereinafter referred to as "the cup 21 is in the retracted position". While the substrate 9 is fed onto or removed from the spin base 11, the cup 21 is placed in the retracted position.

The state where the outer member 213 is placed in the upper position is hereinafter referred to as "the cup 21 is in the processed position". However, the state where "the cup 21 is in the processed position" includes the following three states. A first state is the state where all of the inner member 211, the intermediate member 212, and the outer member 213 are placed in the upper position (the state shown in FIG. 1). In this state, the processing solution scattered from the substrate 9 held on the spin chuck 1 is collected in the space between the inner wall member 211*b* and the guide wall 211*d* of the inner member 211, and is then discharged from the liquid discharge channel. A second state is the state where the inner member 211 is placed in the lower position and the intermediate member 212 and the outer member 213 are placed in the upper position. In this state, the processing solution scattered from the substrate 9 held on the spin chuck 1 is collected in the space between the guide wall 211*d* and the outer wall member 211*c* of the inner member 211, and is then recovered into the first recovery tank. A third state is the state where the inner member 211 and the intermediate member 212 are placed in the lower position and the outer member 213 is placed in the upper position. In this state, the processing solution scattered from the substrate 9 held on the spin chuck 1 is collected in the space between the outer peripheral wall member 212*b* and the outer wall member 212*d* of the intermediate member 212, and is then recovered into the second recovery tank.

<Droplet Supplying Unit 3>

The droplet supplying unit 3 supplies droplets of the processing solution to the substrate 9 held on the spin chuck 1. The droplet supplying unit 3 has a two-fluid nozzle 31 which collides gas with the processing solution to generate droplets of the processing solution and injects the droplets of the processing solution.

Figure 2:
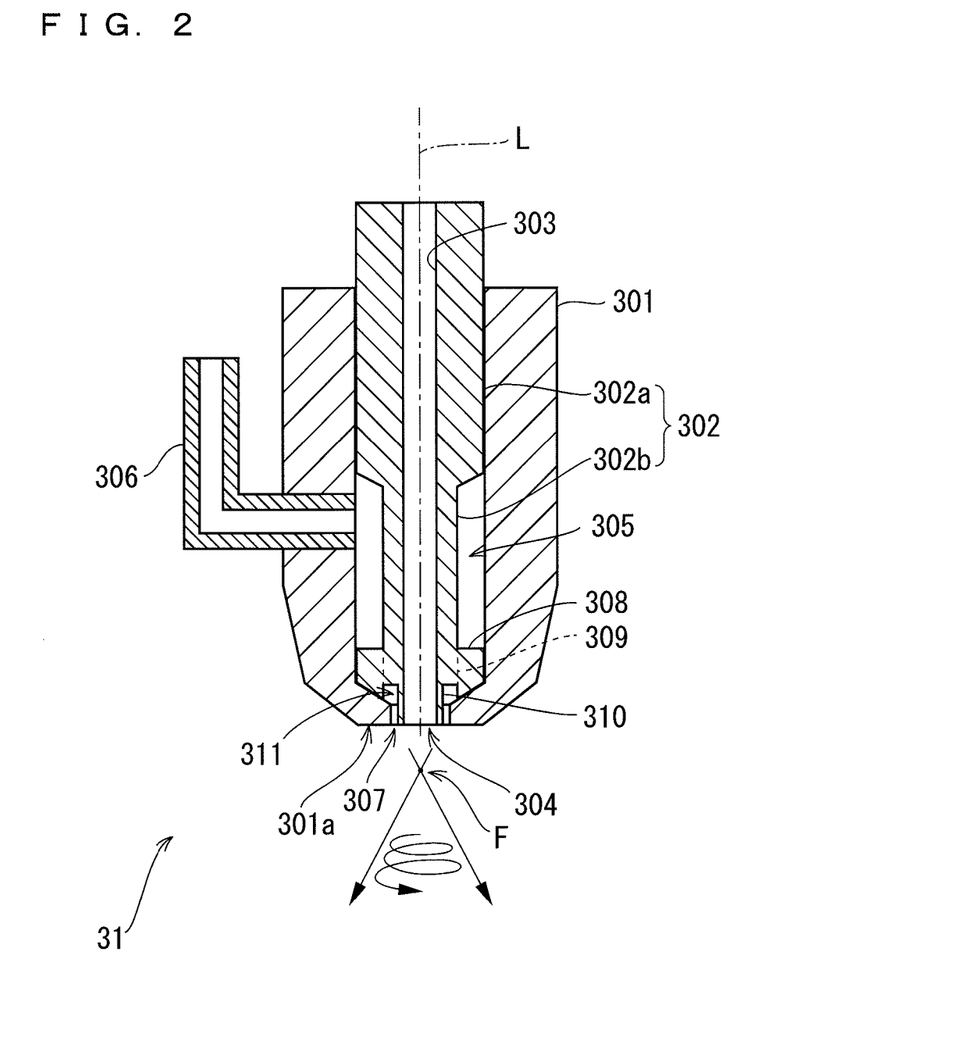
FIG. 2 is a schematic side sectional view of a two-fluid nozzle.

The configuration example of the two-fluid nozzle 31 will be specifically described with reference to FIG. 2. FIG. 2 is a schematic longitudinal sectional view showing the configuration of the two-fluid nozzle 31.

The two-fluid nozzle 31 is a so-called outside mixing type two-fluid nozzle, which outside the casing thereof, collides the gas with the processing solution to generate droplets of the processing solution, and has an outer tubular body 301 configuring the casing, and an inner tubular body 302 fitted inside the outer tubular body 301.

The outer tubular body 301 and the inner tubular body 302 both have a cylindrical outer shape, and are coaxially arranged to share a center axis L. In addition, a lower end face 301a of the outer tubular body 301 is a ring-like surface perpendicular to the center axis L. At the time of processing the substrate 9, the two-fluid nozzle 31 is arranged in the posture such that the center axis L is perpendicular to the top surface of the substrate 9 (that is, in the posture such that the lower end face 301a is parallel to the top surface of the substrate 9).

In the inner tubular body 302, a linear inner space 303 along the center axis L is formed. The inner space 303 is opened in the circular shape at the lower end of the inner tubular body 302. A branch piping 323 (described later) connected to processing solution supply sources 321 and 322 is connected to the upper end of the inner space 303. The processing solution supplied from the processing solution supply sources 321 and 322 through the branch piping 323 flows into the inner space 303, and is then discharged from an opening 304 at the lower end thereof (or is then discharged downwardly along the center axis L). That is, the inner space 303 is a flow passage for the processing solution, and the opening 304 is a discharge opening for the processing solution. Hereinafter, the inner space 303 is also called a "processing solution flow passage 303". In addition, the opening 304 at the lower end of the inner space 303 is also called a "processing solution discharge opening 304".

The inner tubular body 302 has a large diameter portion 302a, and a small diameter portion 302b continuing to the lower side of the large diameter portion 302a and having a smaller outer diameter than the large diameter portion 302a. The inner diameter of the outer tubular body 301 fitted outside the inner tubular body 302 is equal to the outer diameter of the large diameter portion 302a, and the outer tubular body 301 except for the lower end portion thereof has a substantially constant inner diameter. Therefore, between the outer wall of the small diameter portion 302b and the inner wall of the outer tubular body 301, a gap 305 is formed. The gap 305 is a space of ring-shaped cross section about the center axis L, and is opened in the ring shape at the lower end of the outer tubular body 301 (that is, in the ring shape surrounding the processing solution discharge opening 304).

With the vicinity of the upper end of the gap 305, one end of an L-shaped introduction pipe 306 extending through the inner and outer surfaces of the outer tubular body 301 is communicated. To the other end of the introduction pipe 306, piping 332 (described later) connected to a gas supply source 331 is connected. The gas supplied from the gas supply source 331 through the piping 332 and the introduction pipe 306 flows into the gap 305, and is then discharged from an opening 307 at the lower end of the gap 305. That is, the gap 305 is a flow passage for the gas, and the opening 307 is a discharge opening for the gas. Hereinafter, the gap 305 is also called a "gas flow passage 305". In addition, the opening 307 at the lower end of the gap 305 is also called a "gas discharge opening 307".

Near the lower end of the small diameter portion 302b, a flange 308 projecting radially and outwardly from the outer peripheral surface thereof is formed. In the flange 308, a through-hole 309 extending therethrough is formed, and the gas flowing into the gas flow passage 305 is converted with respect to the flowing direction when passing through the through-hole 309, thereby forming a swirl flow flowing to swirl about the center axis L.

In the portion of the small diameter portion 302b below the portion in which the flange 308 is formed, a cylindrical short tubular body 310 projecting from the lower side surface of the flange 308 along the center axis L is formed. The short tubular body 310 is arranged so that the center axis thereof coincides with the center axis L. The outer diameter of the short tubular body 310 is smaller than the inner edge diameter of the lower end face 301a of the outer tubular body 301, and between the lower end face of the short tubular body 310 and the lower end face 301a of the outer tubular body 301, the ring-shaped opening 307 surrounding the center axis L is formed. The opening 307 forms the opening (that is, the gas discharge opening) 307 communicating the gap (that is, the gas flow passage) 305 with the outer space.

The gas flowing into the gas flow passage 305 forms a swirl flow when passing through the through-hole 309 formed in the flange 308, and then flows into a space 311 around the short tubular body 310. Here, the portion of the inner wall surface of the outer tubular body 301 surrounding the short tubular body 310 is formed into the diameter reduction shape in which the inner diameter thereof becomes smaller toward the lower side thereof. Therefore, the swirl flow of the gas flowing into the space 311 around the short tubular body 310 becomes a vortex air flow which approaches the center axis L as it swirls in the space 311, and is then discharged from the gas discharge opening 307. The vortex air flow discharged from the gas discharge opening 307 flows to surround the processing solution discharged from the processing solution discharge opening 304 along the center axis L, and then advances to focus onto a certain point F on the center axis L. Hereinafter, a point F is also called "focusing point F".

When the processing solution is discharged from the processing solution discharge opening 304 and the gas is discharged from the gas discharge opening 307, in the outer space of the two-fluid nozzle 31 (specifically, focusing point F and therenear), the processing solution (that is, the processing solution in the liquid phase) is collided and mixed with the gas to become fine droplets. That is, the droplets of the processing solution are generated. The generated droplets of the processing solution are accelerated by the air flow of the gas to form a jet flow. In other words, below the focusing point F, the gas forms a vortex air flow which moves downwardly while swirling to be remote from the center axis L, and the droplets are accelerated by the air flow to be injected to the substrate 9.

With reference to FIG. 1 again, to the two-fluid nozzle 31, a processing solution supplying unit 32 which is a piping system supplying the processing solution thereto is connected. Specifically, the processing solution supplying unit 32 combines e.g., the first processing solution supply source 321, the second processing solution supply source 322, the branch piping 323, and plural valves 324 and 325.

The first processing solution supply source 321 is the supply source of a first processing solution. The first processing solution is a processing solution containing water. The second processing solution supply source 322 is the supply source of a second processing solution. The second processing solution is an organic solvent having higher volatility than the first processing solution. Here, for example, the first processing solution is deionized water (DIW), and the second processing solution is IPA (isopropyl alcohol).

The first processing solution supply source 321 is connected to one end on the branched side of the branch piping 323, and the second processing solution supply source 322 is connected to the other end on the branched side of the branch piping 323. In addition, the end on the joined side of the branch piping 323 is connected to the two-fluid nozzle 31 (specifically, the inner tubular body 302 of the two-fluid nozzle 31). Between the branched position of the branch piping 323 and the first processing solution supply source 321, the first valve 324 is interposed, and between the branched position of the branch piping 323 and the second processing solution supply source 322, the second valve 325 is interposed.

To the two-fluid nozzle 31, a gas supplying unit 33 which is a piping system supplying the gas thereto is connected. Specifically, the gas supplying unit 33 combines e.g., the gas supply source 331, the piping 332, and a gas valve 333. In this configuration, the gas supply source 331 is a supply source supplying the gas (here, e.g., nitrogen (N2) gas), and is connected through the piping 332 into which the gas valve 333 is interposed, to the two-fluid nozzle 31 (specifically, the introduction pipe 306 of the two-fluid nozzle 31). The gas supply source 331 may supply gas other than the nitrogen gas (e.g., various inert gases other than the nitrogen gas and drying air).

In the above configuration, when the first valve 324 and the gas valve 333 are opened, the deionized water (the deionized water in the liquid phase) supplied from the first processing solution supply source 321 and the nitrogen gas supplied from the gas supply source 331 are supplied to the two-fluid nozzle 31. Then, the deionized water and the nitrogen gas are mixed in the two-fluid nozzle 31 so that the deionized water becomes fine droplets, which form a jet flow to be discharged from the two-fluid nozzle 31.

In addition, when the second valve 325 and the gas valve 333 are opened, the IPA (the IPA in the liquid phase) supplied from the second processing solution supply source 322 and the nitrogen gas supplied from the gas supply source 331 are supplied to the two-fluid nozzle 31. Then, the IPA and the nitrogen gas are mixed in the two-fluid nozzle 31 so that the IPA becomes fine droplets, which form a jet flow to be discharged from the two-fluid nozzle 31.

However, each of the first valve 324, the second valve 325, and the gas valve 333 is electrically connected to the controlling unit 4, and is opened and closed under control of the controlling unit 4 (see FIG. 3). That is, the discharge forms of the processing solution from the two-fluid nozzle 31 (specifically, the discharge start timing, the discharge end timing, the kind of droplets discharged, the discharge flow rate, and the force of droplets discharged) are controlled by the controlling unit 4.

The two-fluid nozzle 31 is mounted at the distal end of a horizontally extending arm 34. The base end of the arm 34 is coupled to the upper end of a lifting/lowering shaft 35 arranged in the posture such that the axis thereof extends in the vertical direction. The lifting/lowering shaft 35 is arranged on a nozzle base 36.

To the nozzle base 36, a nozzle driving unit 37 driving the two-fluid nozzle 31 is arranged. The nozzle driving unit 37 includes e.g., a rotation driving unit (e.g., servo motor) rotating the lifting/lowering shaft 35 about the axis thereof, and a lifting/lowering driving unit (e.g., stepping motor) expanding and contracting the lifting/lowering shaft 35 about the axis thereof. When the nozzle driving unit 37 rotates the lifting/lowering shaft 35, the two-fluid nozzle 31 is moved along the arc trajectory in the horizontal plane, and when the nozzle driving unit 37 expands and contracts the lifting/lowering shaft 35, the two-fluid nozzle 31 is moved in the direction in which the two-fluid nozzle 31 is moved toward and away from the top surface of the substrate 9.

However, the nozzle driving unit 37 is electrically connected to the controlling unit 4, and is operated under control of the controlling unit 4 (see FIG. 3). That is, the position of the two-fluid nozzle 31 is controlled by the controlling unit 4. While the droplet injection from the two-fluid nozzle 31 is not carried out, the controlling unit 4 places the two-fluid nozzle 31 in the position where the two-fluid nozzle 31 does not interfere with the conveying path for the substrate 9 (the retracted position).

<Controlling Unit 4>

The controlling unit 4 is a unit for operation controlling each of the portions in the substrate processing apparatus 100. The same hardware configuration as a typical computer can be adopted to the controlling unit 4. That is, the controlling unit 4 has e.g., a CPU executing various computation processes, a ROM which is a read only memory storing a basic program, a RAM which is a readable and writable memory storing various pieces of information, and a magnetic disk storing controlling software and data. In the controlling unit 4, the CPU as a main controlling unit executes the computation processes according to the procedures described in programs, thereby realizing various functioning units controlling each of the portions in the substrate processing apparatus 100. Some or all of the functioning units realized by the controlling unit 4 may be realized in hardware manner by an exclusive logic circuit. In addition, the memory or hard disk of the controlling unit 4 stores process recipes defining the process contents of the substrate processing apparatus 100.

As shown in FIG. 3, the controlling unit 4 is electrically connected to the rotation driving unit 13, the holding members 15, the cup driving mechanism 22, the first valve 324, the second valve 325, the gas valve 333, the nozzle driving unit 37, and the like. The controlling unit 4 operates each of the portions according to the process recipes thereof, thereby advancing a series of processes for the substrate 9.

<2. Substrate 9>

Figure 4:
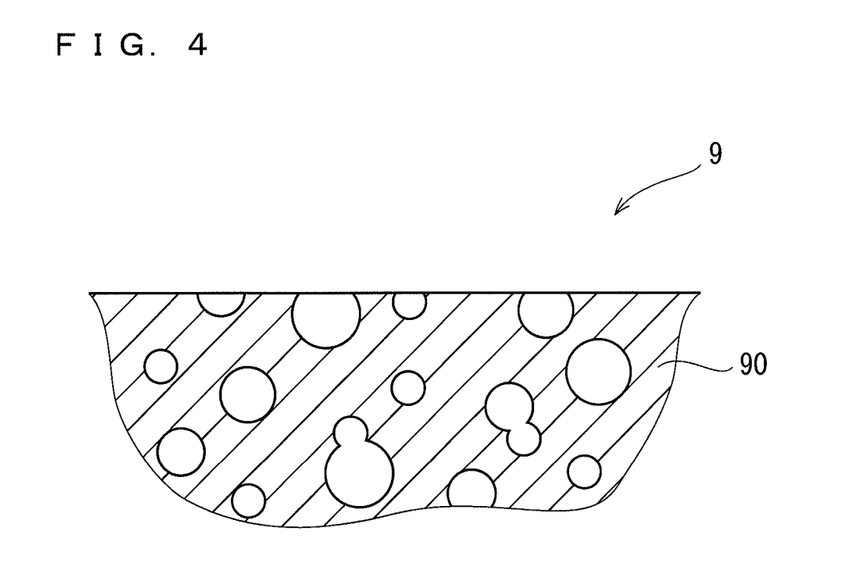
FIG. 4 is a schematic sectional view showing the state in the vicinity of a surface layer of a substrate to be processed.

The state in the vicinity of the surface layer of the substrate 9 to be processed by the substrate processing apparatus 100 will be described with reference to FIG. 4. FIG. 4 is a schematic sectional view showing the state in the vicinity of the surface layer of the substrate 9.

On the surface layer of the substrate 9 to be processed by the substrate processing apparatus 100, a film having a low relative permittivity (k value) (specifically, a film having a relative permittivity of e.g., 2.5 or less, which is a so-called Ultra Low-k film: ULK film) is formed. The film having a relative permittivity of e.g., 2.5 or less has difficulty in being achieved with a dense film, and such a film is achieved with a porous film. That is, on the surface layer of the substrate 9, a ULK film having a porous structure (hereinafter, simply referred to as a "porous film 90") is formed. The average diameter of each porous portion in the porous film 90 is e.g., approximately 0.9 nm (nanometers).

<3. The Flow of the Processes>

Figure 5:
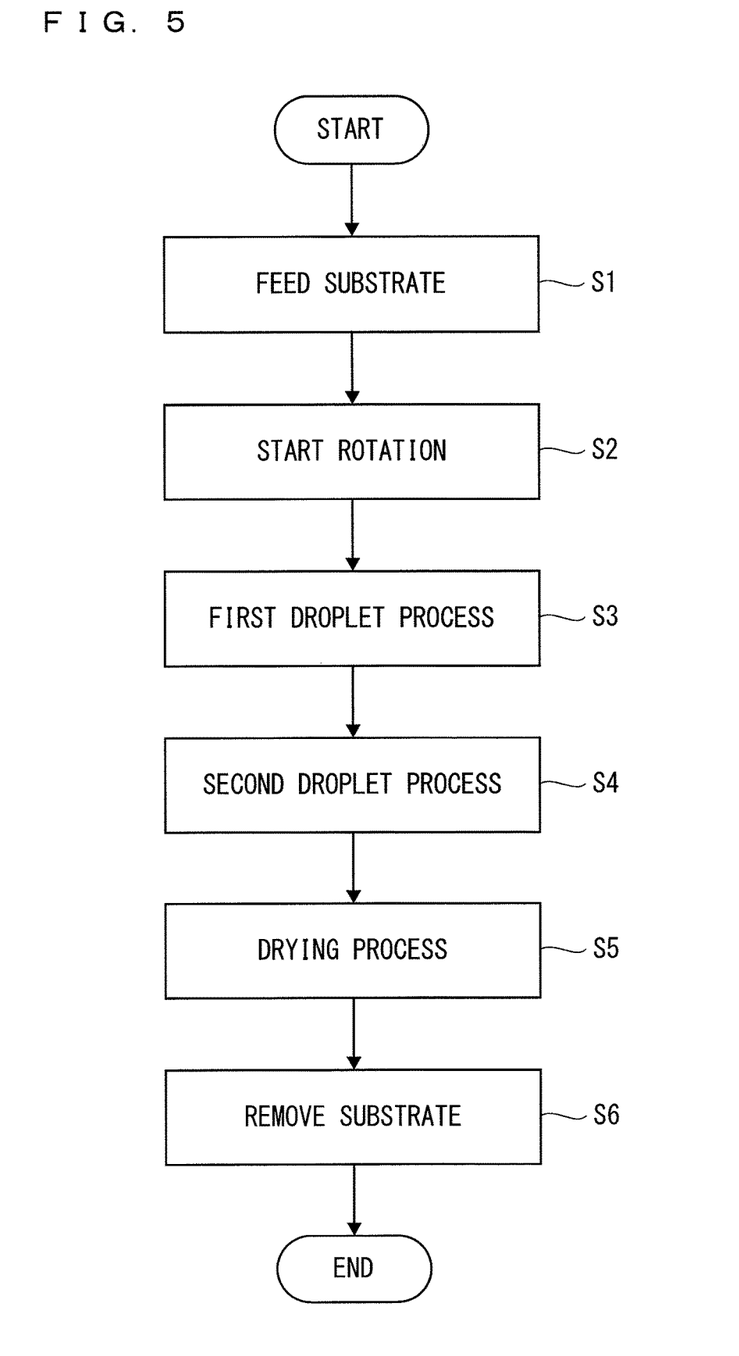
FIG. 5 is a flowchart of assistance in explaining an example of processes carried out by the substrate processing apparatus.

The flow of the processes carried out by the substrate processing apparatus 100 will be described with reference to FIGS. 1 and 5. FIG. 5 is a flowchart showing an example of the flow of the processes carried out by the substrate processing apparatus 100. In the substrate processing apparatus 100, a series of processes described below are carried out under control of the controlling unit 4.

In a state where the cup 21 and the two-fluid nozzle 31 are placed in each of the retracted positions, a conveying robot (not shown) feeds the substrate 9 into the substrate processing apparatus 100, and then places the substrate 9 on the spin base 11 in the posture such that the surface thereof (the surface on the side on which the porous film 90 is formed) directs upwardly (step S1). The substrate 9 placed on the spin base 11 is held by the holding members 15. Thereby, the substrate 9 is held on the spin base 11 in the substantially horizontal posture.

When the substrate 9 is held on the spin base 11, rotation of the spin base 11 is started, whereby rotation of the substrate 9 held on the spin base 11 is started in the horizontal posture (step S2).

Figure 6:
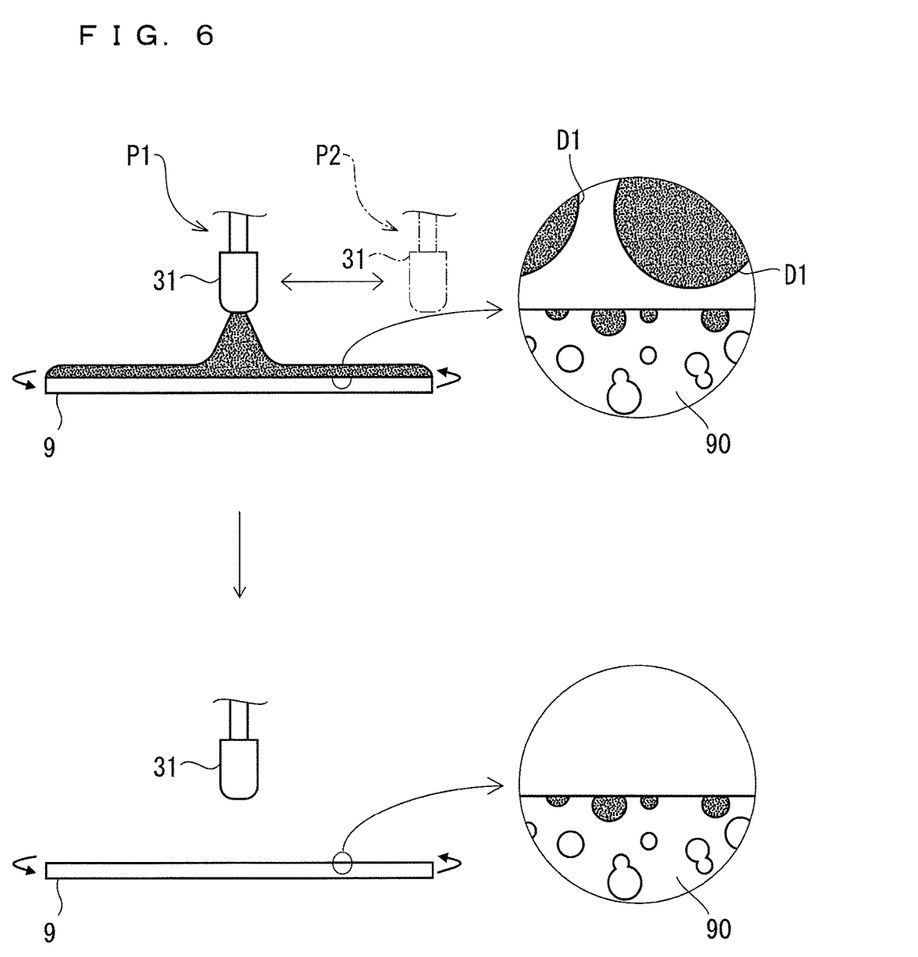
FIG. 6 is a diagram of assistance in explaining a first droplet process.

A first droplet process is carried out (step S3). The first droplet process will be described with reference to FIG. 6. FIG. 6 is a diagram of assistance in explaining the first droplet process, in which a part thereof schematically shows in enlarged dimension the state in the vicinity of the surface of the substrate 9 in the first droplet process.

In the first droplet process, the first valve 324 and the gas valve 333 are opened. Then, the two-fluid nozzle 31 mixes the deionized water with the nitrogen gas to generate the droplets D1 of the deionized water, and then discharges the jet flow of the droplets D1 of the deionized water to the porous film 90 on the substrate 9 being rotated. However, along with the discharge, the nozzle driving unit 37 moves the two-fluid nozzle 31 in the direction perpendicular to the rotation direction of the substrate 9 in the horizontal plane in which the two-fluid nozzle 31 is moved toward the top surface of the substrate 9 on the spin base 11 in the non-contact state. Specifically, the nozzle driving unit 37 reciprocates the two-fluid nozzle 31 along the arc trajectory connecting a first position opposite to the center of the substrate 9 (that is, the position where the jet flow of the droplets discharged from the two-fluid nozzle 31 is collided with the center of the top surface of the substrate 9) P1 and a second position opposite to the peripheral edge of the substrate 9 (that is, the position where the jet flow of the droplets discharged from the two-fluid nozzle 31 is collided with the peripheral edge of the top surface of the substrate 9) P2. When the two-fluid nozzle 31 is reciprocated between the first position P1 and the second position P2 while the substrate 9 is rotated, the landed position of the droplets D1 of the deionized water discharged from the two-fluid nozzle 31 is moved (for scanning) in the entire top surface of the substrate 9, so that the droplets D1 of the deionized water are collided with all the positions in the top surface of the substrate 9. That is, the droplets D1 of the deionized water are supplied to the entire top surface of the substrate 9.

The droplets D1 of the deionized water are collided with each of the positions on the top surface of the substrate 9, thereby physically removing foreign substances (particles) adhering to the positions. Here, mainly, the foreign substances sufficiently larger than the size of the porous portions of the porous film 90 are to be removed. However, when the flow rate of the deionized water supplied to the two-fluid nozzle 31 is the same, as the flow rate of the nitrogen gas supplied to the two-fluid nozzle 31 is larger, the kinetic energy of the droplets injected from the two-fluid nozzle 31 is increased, so that the foreign substance removal rate (Particle Removal Efficiency: PRE) of the substrate 9 can be increased (see graph A1 (DIW) of FIG. 8 described later). In the first droplet process, while the nitrogen gas at a sufficient flow rate is caused to flow so that the kinetic energy of the droplets D1 of the deionized water injected from the two-fluid nozzle 31 becomes sufficiently large (specifically, the droplets D1 of the deionized water have kinetic energy to sufficiently remove the foreign substances on the top surface of the substrate 9), the droplets D1 of the deionized water are generated. By way of example, the flow rate of the deionized water is 0.1 (1/min), and the flow rate of the nitrogen gas is 30 (1/min). The droplets D1 of the deionized water having sufficiently large kinetic energy are forcefully collided with each of the positions in the top surface of the substrate 9, thereby sufficiently removing the foreign substances adhering to the positions. When the droplets D1 of the deionized water having such large kinetic energy are forcefully collided with the substrate 9, the collided droplets D1 of the deionized water partially enter into the porous portions exposed from the surface of the porous film 90.

When a predetermined time elapses after the first valve 324 and the gas valve 333 are opened, the first valve 324 and the gas valve 333 are closed, thereby stopping discharge of the jet flow of the droplets D1 of the deionized water from the two-fluid nozzle 31. The first droplet process is thus ended. As described above, on the top surface of the substrate 9 after the first droplet process is completed, the droplets D1 of the deionized water partially enter into the porous portions exposed from the surface of the porous film 90.

Figure 7:
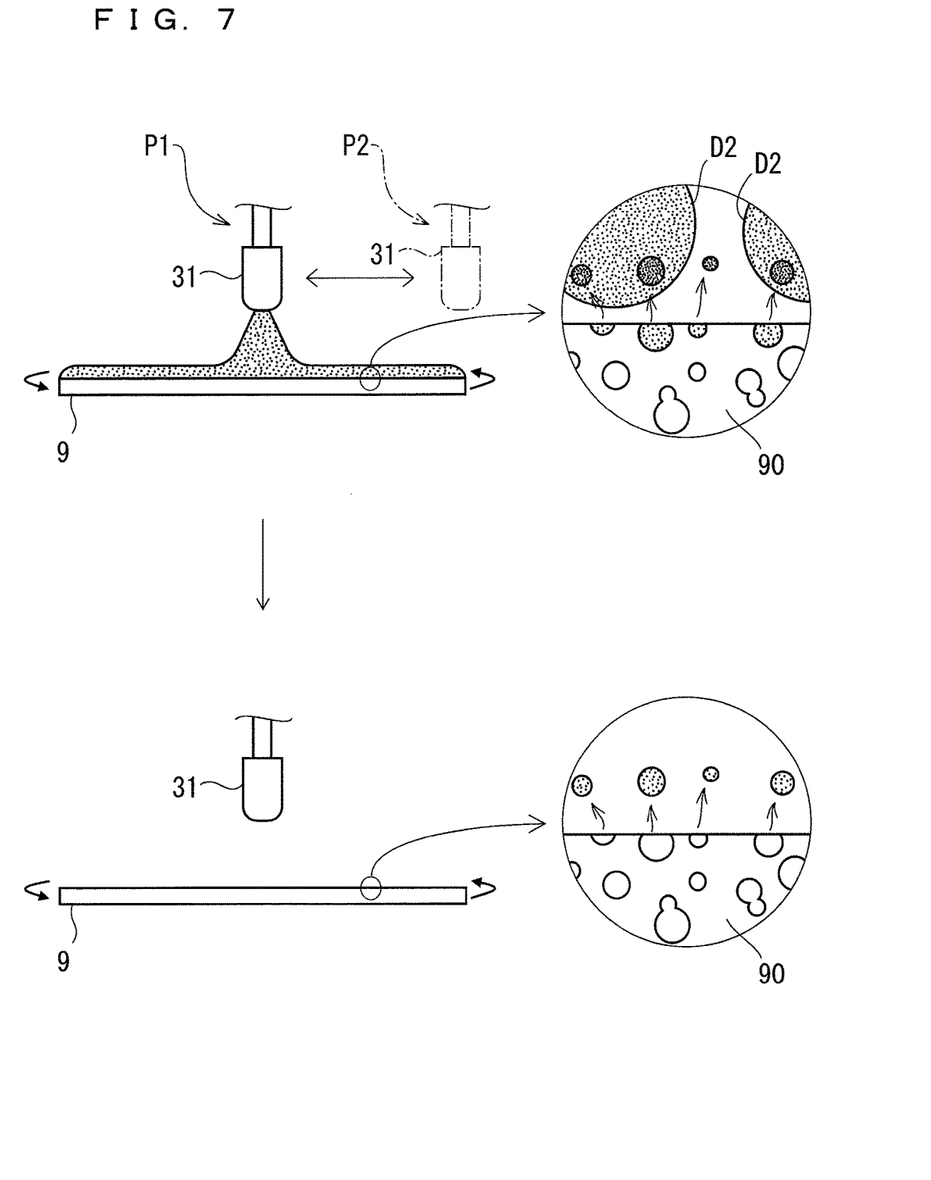
FIG. 7 is a diagram of assistance in explaining a second droplet process.

A second droplet process is carried out (step S4). The second droplet process will be described with reference to FIG. 7. FIG. 7 is a diagram of assistance in explaining the second droplet process, in which a part thereof schematically shows in enlarged dimension the state in the vicinity of the surface of the substrate 9 in the second droplet process.

In the second droplet process, the second valve 325 and the gas valve 333 are opened. Then, the two-fluid nozzle 31 mixes the IPA with the nitrogen gas to generate the droplets D2 of the IPA, and then discharges the jet flow of the droplets D2 of the IPA to the porous film 90 on the substrate 9 being rotated. However, along with the discharge, the nozzle driving unit 37 moves the two-fluid nozzle 31 in the direction perpendicular to the rotation direction of the substrate 9 in the horizontal plane in which the two-fluid nozzle 31 is moved toward the top surface of the substrate 9 on the spin base 11 in the non-contact state. Specifically, the nozzle driving unit 37 reciprocates the two-fluid nozzle 31 along the arc trajectory connecting a first position P1 opposite to the center of the substrate 9 and a second position P2 opposite to the peripheral edge of the substrate 9. Also in the second droplet process, as in the first droplet process, when the two-fluid nozzle 31 is reciprocated between the first position P1 and the second position P2 while the substrate 9 is rotated, the landed position of the droplets D2 of the IPA discharged from the two-fluid nozzle 31 is moved (for scanning) on the entire top surface of the substrate 9, so that the droplets D2 of the IPA are collided with all the positions on the top surface of the substrate 9. That is, the droplets D2 of the IPA are supplied to the entire top surface of the substrate 9.

The droplets D2 of the IPA are collided with each of the positions on the top surface of the substrate 9, thereby physically removing the foreign substances adhering to the positions. In addition, the droplets D2 of the IPA dissolve and remove residues, such as organic substances, adhering to the substrate 9. Further, the droplets D2 of the IPA are supplied to each of the positions on the top surface of the substrate 9, so that the deionized water remaining in the positions are substituted by the IPA. However, also in the second droplet process, while the nitrogen gas at a sufficiently flow rate is caused to flow so that the kinetic energy of the droplets D2 of the IPA injected from the two-fluid nozzle 31 becomes sufficiently large (specifically, the droplets D2 of the IPA collided with the substrate 9 have kinetic energy so that the droplets D2 of the IPA can enter into the porous portions exposed from the surface of the porous film 90), the droplets D2 of the IPA are generated. By way of example, the flow rate of the IPA is 0.1 (l/min), and the flow rate of the nitrogen gas is 30 (l/min). The droplets D2 of the IPA having sufficiently large kinetic energy are forcefully collided with the substrate 9, so that the collided droplets D2 of the IPA partially enter into the porous portions exposed from the surface of the porous film 90, whereby the deionized water remaining in the porous portions is substituted by the IPA. That is, in the second droplet process, not only the deionized water remaining on the surface of the substrate 9, but also even the deionized water which has entered into the porous portions exposed from the surface of the substrate 9, is substituted by the IPA.

When a predetermined time elapses after the second valve 325 and the gas valve 333 are opened, the second valve 325 and the gas valve 333 are closed, thereby stopping discharge of the jet flow of the droplets D2 of the IPA from the two-fluid nozzle 31. The second droplet process is thus ended.

A drying process is carried out (step S5). Specifically, in a state where discharge of the processing solution to the substrate 9 is stopped, the rotational speed of the spin base 11 is increased to a high rotational speed (e.g., a rotational speed higher than the rotational speed at the time of the droplet processes). Thereby, the IPA remaining in the substrate 9 on the spin base 11 is shaken off and removed from the substrate 9, so that the substrate 9 is dried (so-called spin drying). In addition, the IPA is likely to volatilize as compared with the deionized water. Therefore, the IPA substituted for the deionized water in the porous portions volatilizes immediately.

When a predetermined time elapses from start of rotation of the spin base 11 at the high rotational speed, the rotation of the spin base 11 is stopped.

The cup 21 and the two-fluid nozzle 31 are moved to each of the retracted positions, the holding members 15 release the substrate 9, and the conveying robot (not shown) removes the substrate 9 from the substrate processing apparatus 100 (step S6).

The processes for the substrate 9 are thus ended.

<4. The Relation Between the Cleaning Form and Damages>

Here, the relation between the cleaning form of the substrate 9 with the porous film 90 formed on the surface layer thereof and damages to the substrate 9 will be described with reference to FIGS. 8 and 9.

The present inventors have found that when the droplets of the deionized water generated by mixing the deionized water with the nitrogen gas are injected to the substrate 9 with the porous film 90 formed on the surface layer thereof, when the flow rate of the deionized water is the same, as the flow rate of the nitrogen gas is larger, the foreign substance removal rate (Particle Removal Efficiency: PRE) is increased (see graph A1 (DIW) of FIG. 8, in which the vertical axis represents the foreign substance removal rate, and the horizontal axis represents the flow rate of the nitrogen gas. In addition, the flow rate of the deionized water in each sample is equal). This is because as the flow rate of the nitrogen gas is larger, the kinetic energy of the generated droplets of the deionized water is increased, whereby the physical force removing the foreign substances are larger.

Figure 8:
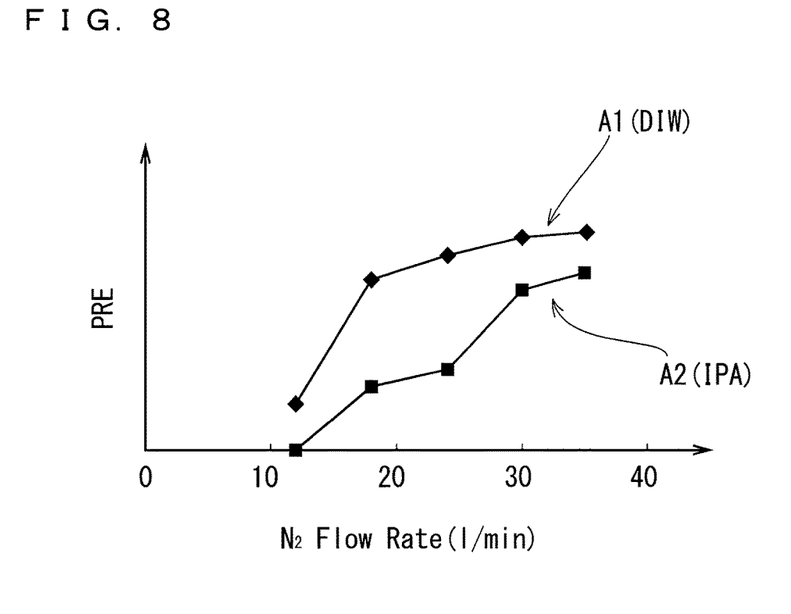
FIG. 8 is a graph showing the form of change in foreign substance removal rate of each of deionized water and IPA with increase of the flow rate of nitrogen gas.

The present inventors have found that when the droplets of the processing solution generated by mixing the processing solution with the nitrogen gas are injected to the substrate 9 with the porous film 90 formed on the surface layer thereof, in the case where the droplet generation conditions (the flow rate of the processing solution and the flow rate of the nitrogen gas) are equal, use of the deionized water as the processing solution can obtain the higher foreign substance removal effect than use of the IPA as the processing solution (see graph A2 (IPA) of FIG. 8, in which the flow rate of the deionized water in all the samples in graph A1 (DIW) and the flow rate of the IPA in all the samples in graph A2 (IPA) are equal). This is because, as the surface tension of the deionized water is larger than the surface tension of the IPA and the deionized water has a higher specific gravity, when the droplets of the deionized water and the droplets of the IPA generated by using the nitrogen gas in the same amount are compared, the droplets of the deionized water have the larger physical force removing the foreign substances.

Based on the above experiments and consideration, to increase the foreign substance removal rate of the substrate 9 with the porous film 90 formed on the surface layer thereof, it is effective that the deionized water is mixed with the nitrogen gas at a sufficient flow rate to generate the droplets of the deionized water, thereby injecting the droplets of the deionzied water to the substrate 9.

Figure 9:
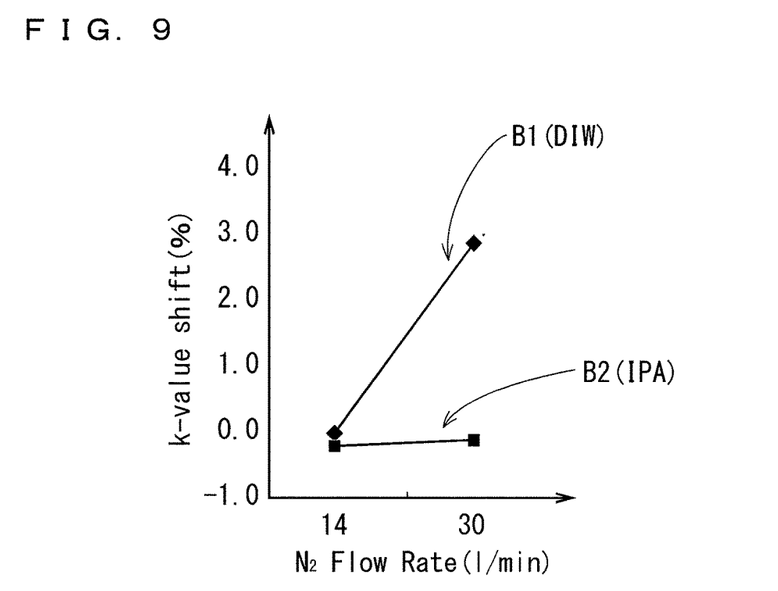
FIG. 9 is a graph showing the form of change in relative permittivity of each of the deionized water and the IPA with increase of the flow rate of the nitrogen gas.

However, the present inventors have found that when the amount of the nitrogen gas mixed with the deionized water is increased, the relative permittivity of the porous film 90 subjected to injection of the generated droplets of the deionized water is increased (see graph B1 (DIW) of FIG. 9, in which the vertical axis represents the rate of change in relative permittivity, and the horizontal axis represents the flow rate of the nitrogen gas). The reason why the relative permittivity of the porous film 90 is increased when the deionized water is mixed with the nitrogen gas in relatively large amount to generate the droplets of the deionized water, thereby injecting the droplets of the deionized water to the substrate 9 can be considered as follows. That is, the typical average diameter of the porous portions of the porous film 90 is very small and is approximately 0.9 nm, and the size of the droplets of the deionized water is larger than the size of the porous portions. Consequently, when the kinetic energy of the droplets is relatively small, the droplets cannot enter into the porous portions. However, as described above, since the kinetic energy of the generated droplets of the deionized water is increased as the flow rate of the nitrogen gas becomes larger, when the droplets generated while the nitrogen gas at a flow rate exceeding a boundary value flows are injected to the substrate 9, the droplets of the deionized water having too large kinetic energy are partially pushed into the porous portions. Since the deionized water which has entered into the porous portions has difficulty in being removed by spin drying, the deionized water remains in the porous portions, leading to increase of the relative permittivity of the porous film 90. The deionized water which has entered into the porous portions can lead, not only to increase of the relative permittivity, but also to corrosion of the metal component of the substrate 9. That is, the deionized water which has entered into the porous portions can cause various damages to the substrate 9.

Based on the above experiments and consideration, the present inventors have found that, to increase the foreign substance removal rate of the substrate 9 with the porous film 90 formed on the surface layer thereof, although it is effective that the deionized water is mixed with the nitrogen gas at a sufficient flow rate to generate the droplets of the deionized water, thereby injecting the droplets of the deionized water to the substrate 9, such a cleaning form can cause various damages (increase of the relative permittivity and corrosion of the metal component) to the substrate 9.

Further, the present inventors have found that even when the amount of the nitrogen gas mixed with the IPA is increased, the relative permittivity of the porous film 90 subjected to injection of the generated droplets of the IPA is unlikely to increase (graph B2 (IPA) of FIG. 9). This is because even when the droplets of the IPA having higher volatility than the deionized water enter into the porous portions, the droplets of the IPA volatilize immediately without remaining in the porous portions. That is, the IPA which has entered into the porous portions is unlikely to cause the damages to the substrate 9.

As described above, in the substrate processing apparatus 100, the deionized water is mixed with the nitrogen gas to generate the droplets of the deionized water, thereby injecting the droplets of the deionized water to the substrate 9 (step S3: the first droplet process), and after that, the IPA is mixed with the nitrogen gas to generate the droplets of the IPA, thereby injecting the droplets of the IPA to the substrate 9 (step S4: the second droplet process).

With this configuration, in the first droplet process, the droplets of the deionized water having the higher foreign substance removal ability than the IPA can effectively remove the foreign substances adhering to the substrate 9 with the porous film 90 formed on the surface layer thereof. Even when the deionized water enters into the porous portions in the first droplet process, in the second droplet process, the deionized water is substituted by the IPA to be removed from the interior of the porous portions. Therefore, the damages to the substrate 9 due to remaining of the deionized water in the porous portions cannot occur. That is, without fear of the damages to the substrate 9, the flow rate of the nitrogen gas at the time of generating the droplets of the deionized water can be increased. In addition, the IPA in the porous portions volatilize immediately, so that the IPA cannot cause the damages to the substrate 9. With the above form, the substrate 9 with the porous film 90 formed on the surface layer thereof can be sufficiently cleaned while the damages are prevented.

In the above description, the deionized water is used as the first processing solution, and the IPA is used as the second processing solution, but when the processing solution containing water is used as the first processing solution and when the organic solvent having higher volatility than the first processing solution is used as the second processing solution, any processing solution combination other than the combination of the deionized water and the IPA can obtain the same effect as previously described. That is, when the processing solution containing water (e.g., carbonated water) is used as the first processing solution, the foreign substance removal effect equal to or higher than that when the deionized water is used as the first processing solution can be obtained. In addition, even when the first processing solution enters into the porous portions in the first droplet process, in the second droplet process, the first processing solution is substituted by the second processing solution to be removed from the interior of the porous portions, so that the damages to the substrate 9 due to remaining of the water in the porous portions cannot occur. When as the second processing solution, the organic solvent having higher volatility than the first processing solution (e.g., the organic solvent containing at least one of methanol, ethanol, acetone, and the IPA) is used, the first processing solution in the porous portions can be easily substituted by the second processing solution, so that the first processing solution can be sufficiently avoided from remaining in the porous portions. The second processing solution which has been substituted for the first processing solution and entered into the porous portions volatilizes immediately, so that the second processing solution cannot cause the damages to the substrate 9.

<5. Effects>

In the above embodiment, the droplets of the first processing solution containing water can effectively remove the foreign substances adhering to the substrate 9. In the next process, the first processing solution which has entered into the porous portions of the porous film 90 is substituted by the second processing solution, and is then removed from the interior of the porous portions. Therefore, the damages to the substrate 9 due to remaining of the first processing solution containing water in the porous portions cannot occur. The second processing solution in the porous portions volatilizes immediately, so that the second processing solution cannot cause the damages to the substrate 9. According to the above preferred embodiment, the substrate with the porous film 90 formed on the surface layer thereof can be sufficiently cleaned while the damages are prevented.

According to the above preferred embodiment, the landed position of the droplets of the first processing solution is moved, so that the droplets of the first processing solution can be collided with the wide range in the top surface of the substrate 9 (in the above preferred embodiment, the entire top surface of the substrate 9). Thereby, the interior of the top surface of the substrate 9 can be cleaned particularly sufficiently.

According to the above preferred embodiment, the landed position of the droplets of the second processing solution is moved, so that the droplets of the second processing solution can be collided with the wide range in the top surface of the substrate (in the above preferred embodiment, the entire top surface of the substrate 9). Thereby, occurrence of the damages to the interior of the top surface of the substrate 9 can be prevented particularly sufficiently.

<6. Modification>

According to the above preferred embodiment, the two-fluid nozzle 31 is a so-called outside mixing type two-fluid nozzle which collides the nitrogen gas with the processing solution outside the casing to generate the droplets of the processing solution, but may be a so-called inside mixing type two-fluid nozzle which collides the nitrogen gas with the processing solution inside the casing to generate the droplets of the processing solution.

According to the above preferred embodiment, the two-fluid nozzle 31 injects the droplets to the substrate 9 while being moved, but may inject the droplets to a predetermined position in the top surface of the substrate 9 without being moved. For example, at least either the droplets of the deionized water or the droplets of the IPA may be injected from the stationary two-fluid nozzle 31 to e.g., the center of the substrate 9.

According to the above preferred embodiment, along with injection of the droplets of the deionized water from the two-fluid nozzle 31 to the substrate 9, the deionized water in the liquid phase may be discharged and supplied from a straight nozzle or the like to e.g., the center of the substrate 9.

According to the above preferred embodiment, along with injection of the droplets of the IPA from the two-fluid nozzle 31 to the substrate 9, the IPA in the liquid phase may be discharged and supplied from a straight nozzle or the like to e.g., the center of the substrate 9.

According to the above preferred embodiment, while at least one of the first droplet process and the second droplet process is carried out, the gas (e.g., the nitrogen gas) may be continuously supplied to the top surface of the substrate 9 on the spin base 11 (so-called cover gas).

According to the above preferred embodiment, the spin chuck 1 is a sandwiching type chuck which sandwiches the substrate 9 in the horizontal direction, but may be a vacuum type chuck which absorbs the lower surface of the substrate 9.

According to the above preferred embodiment, the substrate 9 is a semiconductor wafer, but may be a glass substrate for a liquid crystal display device, a glass substrate for a plasma display, a substrate for an optical disk, a substrate for a magnetic disk, a substrate for a magneto-optical disk, a glass substrate for a photomask, and a substrate for a solar battery.

As described above, the present invention has been shown and described in detail, but the above description is only illustrative and is not limited to all the forms. Therefore, the preferred embodiment of the present invention can be modified and omitted in the scope of the present invention, as needed.

While the invention has been shown and described in detail, the foregoing description is in all aspects illustrative and not restrictive. It is therefore understood that numerous modifications and variations can be devised without departing from the scope of the invention.

What is claimed is:

1. A method for processing a substrate with a porous film having a porous structure formed on a surface layer thereof comprising:
    a) mixing a first processing solution containing water with gas to generate droplets of said first processing solution and injecting the droplets of said first processing solution to said porous film; and
    b) after said a) step, mixing a second processing solution which is an organic solvent having higher volatility than said first processing solution with the gas to generate droplets of said second processing solution, injecting the droplets of said second processing solution to said porous film, and substituting said first processing solution which has entered into porous portions exposed from a surface of said porous film by said second processing solution.

2. The method according to claim 1, wherein said first processing solution is deionized water.

3. The method according to claim 1, wherein said second processing solution is isopropyl alcohol.

4. The method according to claim 1, wherein in said a) step, while a landed position of the droplets of said first processing solution is moved, the droplets of said first processing solution are injected to said porous film.

5. The method according to claim 1, wherein in said b) step, while a landed position of the droplets of said second processing solution is moved, the droplets of said second processing solution are injected to said porous film.

6. The method according to claim 1,
    wherein in said a) step, the droplets of said first processing solution are collided with the surface of said substrate, thereby physically removing foreign substances adhering to the positions by the kinetic energy of said droplets, and
    wherein in said b) step, the droplets of said second processing solution are collided with the surface of said substrate, thereby physically removing foreign substances adhering to the positions by the kinetic energy of said droplets as well as substituting said first processing solution which has entered into said porous portions by said second processing solution.

7. The method according to claim 1,
    wherein in said a) step, the droplets of said first processing solution are collided with the entire surface of said substrate, and
    wherein in said b) step, the droplets of said second processing solution are collided with the entire surface of said substrate.

8. The method according to claim 1, wherein the droplets of said first processing solution and said second processing solution are larger than a diameter of said porous portions.

* * * * *